United States Patent [19]

Ferris et al.

[11] Patent Number: 4,661,727
[45] Date of Patent: Apr. 28, 1987

[54] MULTIPLE PHASE-SPLITTER TTL OUTPUT CIRCUIT WITH IMPROVED DRIVE CHARACTERISTICS

[75] Inventors: David A. Ferris, West Buxton, Me.; Richard J. Caswell, Swindon, England

[73] Assignee: Fairchild Semiconductor Corporation, Palo Alto, Calif.

[21] Appl. No.: 632,433

[22] Filed: Jul. 19, 1984

[51] Int. Cl.$^4$ ............... H03K 19/013; H03K 19/088; H03K 17/04; H03K 17/60

[52] U.S. Cl. ................................. 307/456; 307/473; 307/443; 307/254

[58] Field of Search ............... 307/443, 454, 456–458, 307/473, 299 A, 270, 25 A

[56] References Cited

U.S. PATENT DOCUMENTS

| | | | |
|---|---|---|---|
| 3,602,733 | 8/1971 | Aoki | 307/473 |
| 3,962,589 | 6/1976 | Priel et al. | 307/456 |
| 4,255,670 | 3/1981 | Griffith | 307/473 |
| 4,287,433 | 9/1981 | Goodspeed | 307/473 |
| 4,321,490 | 3/1982 | Bechdolt | 307/458 X |
| 4,355,246 | 10/1982 | Usui | 307/456 |
| 4,467,223 | 8/1984 | Neely | 307/456 X |
| 4,481,430 | 11/1984 | Houk et al. | 307/456 X |
| 4,562,364 | 12/1985 | Tanizawa | 307/456 X |

FOREIGN PATENT DOCUMENTS 0025831 3/1981 Japan .................... 307/473

Primary Examiner—Stanley D. Miller
Assistant Examiner—David R. Bertelson
Attorney, Agent, or Firm—Kenneth Olsen; David H. Carroll; Daniel H. Kane, Jr.

[57] ABSTRACT

A multiple phase-splitter TTL tristate output circuit having a feedback diode coupled between the signal output and the collector of a first phase-splitter transistor to accelerate sinking of current from the output to low potential during transition of binary signals at the output from high to low potential. An independent base drive is coupled to the base of the first phase-splitter transistor independent from any base drive coupled to the other phase-splitter transistor or transistors. Current hogging of the base drive current to the first phase-splitter transistor by the other phase-splitter transistors is thereby prevented. The first phase-splitter transistor which is coupled in the feedback circuit with the accelerating feedback diode to the base of the pulldown transistor element can therefore maintain the high current sinking mode through the pulldown transistor element with gain step-up proportional to $\beta^2$ when the output is at the high voltage level.

11 Claims, 4 Drawing Figures

MULTIPLE PHASE-SPLITTER TTL OUTPUT CIRCUIT WITH IMPROVED DRIVE CHARACTERISTICS

TECHNICAL FIELD

This invention relates to an improved multiple phase-splitter TTL tristate output device having a large sink current capability without increasing the power to the device. The invention is particularly suitable in output device applications for driving large capacity loads or low impedance transmission lines.

BACKGROUND ART

A typical Transistor-Transistor Logic (TTL) output circuit or output device for delivering binary logic signals of high or low potential at the signal output OUT is illustrated in FIG. 1. The output device includes a pullup transistor element consisting of the Darlington transistor pair Q5 and Q6 for sourcing current to the signal output OUT from high potential source Vcc and for pulling the output OUT to the logic high level or high potential. The pulldown transistor element Q4 sinks current from the signal output OUT to low potential or ground for establishing a logic low level or low potential signal at the output OUT. The respective conducting states of the pullup and pulldown transistor elements are controlled by the phase-splitter transistor Q3.

When a low level or low potential input signal appears at the signal input IN and input transistor Q1, the phase-splitter base drive current through base drive resistor R1 from high potential source Vcc is diverted and the phase-splitter transistor Q3 is nonconducting. The pulldown transistor Q4 is therefore also nonconducting. Base drive current passes through resistor R3 from potential source Vcc to the base of pullup transistor element Q5, part of the Darlington transistor pair Q5 and Q6. With the pullup transistor element conducting a logic high level or high potential appears at the signal output OUT.

When a high level or high potential signal appears at the signal input iN, then base drive current through resistor R1 is directed to the base of phase-splitter transistor Q3 turning it on. With transistor Q3 conducting the base drive current to the pullup transistor element through resistor R3 is diverted through the collector to emitter of the phase-splitter to the base of the output pulldown transistor Q4. With pulldown transistor Q4 conducting a low level signal or low potential appears at the signal output OUT.

The feedback diode D2 provides a large sink current capability when the output is at high potential for transition at the output from high to low potential. With phase-splitter transistor Q3 conducting the feedback current from the output through diode D2 is amplified by phase-splitter transistor Q3 and applied to the base of pulldown transistor Q4. As hereafter further explained, the increase in output sink current through pulldown transistor Q4 is proportional to $\beta^2$ during transition from high to low level at the signal output OUT.

As shown in FIG. 1 the typical TTL output device or output circuit with the feedback diode circuit and high current seeking mode is capable of operating only as a bistate device delivering high and low level logic signals at the output for low and high level logic signals appearing at the input. Unlabeled components of the output device of FIG. 1 are typical components well known to those skilled in the art.

Further analysis indicates how the feedback diode D2 enhances the output sink circuit in the prior art TTL output circuit of FIG. 1. When the signal output OUT is at the binary low level or low potential, the output sink current IOL through the collector to emitter circuit of pulldown transistor Q4 is determined by beta, $\beta$, the gain of the pulldown transistor Q4 and the base current to transistor Q4, IbQ4.

$$IOL = \beta * IbQ4 \tag{1}$$

With the signal output OUT at low potential and the phase-splitter transistor Q3 conducting, IbQ4 is in turn the Kirchoff sum of the collector current IcQ3 and the base current IbQ3 through transistor Q3 less the current through squaring network resistor R4, IR4, as follows:

$$IbQ4 = IbQ3 + IcQ3 - IR4 \tag{2}$$

IcQ3 is in turn the Kirchoff sum of the current through R3, IR3, and the current through D2, ID2.

$$IcQ3 = IR3 + ID2 \tag{3}$$

Diode D1 provides a low impedance discharge path for the base of transistor Q6 and the current through diode D1 is neglected because in steady state conditions, it is either reverse biased or conducting substantially less than D2.

If the output voltage Vo is less than the sum of the voltage drop across the base to emitter junction of pulldown transistor Q4, VbeQ4, the voltage drop across the collector to emitter junction of phase-splitter transistor Q3 at saturation, VsatQ3, and the voltage drop across diode D2, VD2, then no feedback current will conduct through diode D2 and the expression for the output sink current IOL through pulldown transistor Q4 is given by:

$$IOL(Vo < VbeQ4 + VsatQ3 + VD2) = \beta*(IbQ3 + IR3 - IR4) \tag{4}$$

If, however, Vo is greater than VbeQ4+VsatQ3+VD2, then diode D2 will conduct sufficient current to pull the phase-splitter Q3 out of saturation and into the linear operating region. When phase-splitter transistor Q3 is operating in the linear region out of saturation, the collector current IcQ3 becomes:

$$IcQ3 = \beta * IbQ3 \tag{5}$$

The output sink current IOL through pulldown transistor Q4 therefore becomes:

$$IOL(Vo > VbeQ4 + VsatQ3 + VD2) = \beta*((\beta+1)*IbQ3 - IR4) \tag{6}$$

The difference IOLD in the output sink current IOL between the high and low voltage potentials at the output reduces to:

$$IOLD = \beta^2 * IbQ3 - \beta * IR3 \tag{7}$$

The difference between the low voltage output sink current capability and the high voltage output sink current capability, that is the step up in the output sink current from low voltage potential to high voltage potential at the output is therefore proportional to $\beta^2$. By use of the feedback diode D2, the ability of the typical bistate TTL output device to drive large capacity loads or to drive low impedance transmission lines is greatly enhanced without resorting to large increases in base drive to the pulldown transistor Q4 and without increasing the power requirements and power consumption of the output device.

In order to provide a tristate TTL output device capable of establishing a high impedance third state at the signal output OUT for common bus applications, a modification of the TTL output device is required. For example, dual phase-splitter transistors are connected in current mirror configuration as described in U.S. Pat. No. 4,255,670 entitled "Transistor Logic Tristate Output With Feedback". Such a tristate output device with feedback is illustrated in FIG. 2 in which the circuit components which perform the same function as in FIG. 1 are similarly designated. Instead of a single phase splitter transistor Q3 as shown in the bistate output device of FIG. 1, the tristate output device of FIG. 2 includes dual phase-splitter transistors Q2 and Q3 connected in current mirror configuration. In this configuration, the emitters are coupled in parallel to the base of pulldown transistor Q4 for jointly controlling the conducting state of the pulldown transistor element, while the bases of phase-splitter transistors Q2 and Q3 are also tied together at a common terminal at the collector of the input transistor Q1. The collector of the second phase splitter transistor Q2 is coupled through its own collector circuit including collector resistor R2 and diode D3 to the high potential source Vcc.

The tristate output device of FIG. 2 also includes an enable input OE for establishing the high impedance third state. The enable input OE is connected through diode D7 to the base of the pullup transistor element composed of the Darlington pair Q5 and Q6 for disabling the pullup transistor element when a low level or low potential signal appears at the input enable OE. Similarly, the enable input OE is tied through diode D6 to the bases of the dual phase-splitter transistors Q2 and Q3 so that they also are disabled by a low level or low potential signal at the enable input OE. With the phase-splitter transistors nonconducting, the pulldown transistor Q4 is also disabled. With the low level signal at enable input OE, the tristate output device therefore constitutes a high impedance at the signal output OUT and appears or behaves as if it were not there. When a high level signal appears at the enable input OE, the output device operates in the normal bistate mode of operation.

The advantage of the dual phase-splitter transistor elements Q2 and Q3 in combination with the enable input or enable gate is apparent. Only the collector of phase-splitter transistor Q3 is connected to the base of the pullup transistor element for controlling the conducting state of the pullup transistor element. It is the collector of phase-splitter transistor Q3 only that is connected to the enable gate or enable input OE. The collector of phase-splitter transistor Q2 is not connected to the enable gate. Rather, the feedback diode D2 from the signal output OUT and the feedback diode D1 from the base of transistor Q6 are coupled to the collector of phase-splitter transistor Q2. There is no direct coupling therefore between the signal output OUT and the enable gate or enable input OE which would otherwise destroy the high impedance third state. The addition of the second phase-splitter transistor therefore permits the combination of both the feedback diode D2 for accelerated sinking of current from the signal output OUT to ground during the transition at the output from high to low potential, and the enable input OE for establishing the high impedance third state. Furthermore, the blocking diode D3 blocks any current flow from the signal output OUT through the device to the high potential source Vcc.

In summary, the TTL tristate output device with feedback described in U.S. Pat. No. 4,255,670 and illustrated in FIG. 2 provides a plurality of phase-splitter transistors having emitters coupled in parallel for controlling the conducting state of the pulldown transistor element. The collector of a first phase-splitter transistor element is coupled to the base of the pullup transistor element for controllng the conducting state of the pullup transistor element and is also coupled to the enable gate enable input for establishing the high impedance third state. The collector of a second phase-splitter transistor element is coupled to the feedback diode for enhancing the current sinking capability at the signal output OUT by increasing the base drive to the pulldown transistor element. Thus, multiple phase splitter transistors are added with divided functions to combine the tristate enable input and the accelerating feedback diode in the same output device.

A disadvantage attendant upon the combination circuit of FIG. 2, however, is that the full square law enhancement or step-up of the output sink current between the low voltage level and high voltage level at the signal output OUT is lost. The output sink current capability of the multiple phase-splitter transistor TTL tristate output device of FIG. 2 when the multiple phase-splitters are connected in current mirror configuration is as follows. With a high level signal at the signal input IN and a low level signal at the signal output OUT the output sink current IOL through the pulldown transistor Q4 is:

$$IOL = \beta * IbQ4 \tag{8}$$

In this instance, however, the base drive current IbQ4 is the Kirchoff sum of the base current from phase-splitter transistor Q2, IbQ2, the collector current through transistor Q2, IcQ2, the base current from phase-splitter transistor Q3, IbQ3, and the collector current from transistor Q3, IcQ3, less the current through squaring network reistor R4, IR4 as follows:

$$IbQ4 = IbQ2 + IcQ2 + IbQ3 + IcQ3 - IR4 \tag{9}$$

The collector current through transistor Q2, IcQ2 is in turn the Kirchoff sum of the current through collector resistor R2, IR2 and the feedback current through diode D2, ID2:

$$IcQ2 = IR2 + ID2 \tag{10}$$

Again, any current through diode D1 is neglected.

When the output voltage Vo at the signal output OUT is at low potential and less than the voltage drop across the base to emitter junction of pulldown transistor Q4, VbeQ4 plus the voltage drop across the collector to emitter junction of phase-splitter transistor Q2 at saturation, VsatQ2 lus the voltage drop across diode D2, VD2, and therefore no feedback current is flowing from the signal output OUT through diode D2, the output sink current through pulldown transistor Q4 is:

$$IOL(Vo < VbeQ4 + VsatQ2 + VD2) = \beta^*(IbQ2 + IR2 - IbQ3 + IcQ3 - IR4) \qquad (11)$$

When the voltage Vo at signal output OUT is greater than VbeQ4+VsatQ2+VD2, feedback diode D2 becomes forward biased and passes sufficient feedback current from the signal output to pull phase-splitter transistor Q2 out of saturation and into the linear operating range of the transistor. However, because of the current mirror configuration of the phase-splitter transistors Q2 and Q3, as the feedback current through diode D2 to the collector of phase-splitter transistor Q2 is increased, the base current to transistor Q2 decreases. This relationship obtains because in the current mirror configuration the emitter currents of transistors Q2 and Q3 tend to maintain a constant ratio or proportionality according to the ratio of the emitter areas, and in fact tend to remain equal for the example of mirror coupled transistors having equal emitter areas assuming the collector resistors R2 and R3 are equal. This condition may be stated in the following equation.

$$IbQ2 + IR2 + ID2 = IbQ3 + IcQ3 \qquad (12)$$

There is also the additional restraint that:

$$IbQ2 + IbQ3 = IR1 \qquad (13)$$

When the feedback diode D2 is nonconducting and ID2 equals 0, the collector currents and base currents of the phase-splitter transistors Q2 and Q3 are respectively matched with each other according to the following equalities assuming by way of example that the emitter areas are equal and resistor R2 equals R3:

$$IcQ2 = IR2 = IcQ3 = IR3 \qquad (14)$$

$$IbQ2 = IbQ3 = IR1/2 \qquad (15)$$

With the output voltage Vo at a sufficient level so that feedback diode D2 is conducting, the feedback current ID2 necessary to force phase-splitter transistor Q2 out of saturation and into the linear operating region is:

$$ID2 = IbQ3 + IcQ3 - IbQ2 - IR2$$

$$ID2 = (IbQ3 + IcQ3)^*(\beta^*1/(\beta+1)) - IR2$$

$$ID2 = IcQ3 + IbQ3 - IR2$$

$$ID2 = IcQ3 + IR1 - IR2 \qquad (16)$$

With this level of feedback current as set forth in equation (16), the phase-splitter transistor Q2 operates just on the edge of its linear operating range while phase-splitter transistor Q3 is saturated, "hogging" essentially all of the base drive current IR1 through resistor R1. In equation (16) the $1/\beta$ term has been disregarded and dropped as being negligible compared to 1 for reasonable values of $\beta$.

Substituting equations (15), (13), (10) and (9) into equation (8) yields the following expression for the output sink current IOL when a low voltage level signal is applied at the output OUT.

$$IOL(Vo > VbeQ4 + VsatQ2 + VD2) = \beta^*(2^*(IcQ3 + IR1) - IR4) \qquad (17)$$

Substituting equation (13) into equation (11) yields the following expression for the output sink current IOL for a high voltage level signal at the output OUT:

$$IOL(Vo < VbeQ4 + VsatQ2 + VD2) = \beta^*(IcQ3 + IR1 + IR2 - IR4) \qquad (18)$$

Comparing and subtracting equations (17) and (18) gives the following current difference IOLD between the output sink current IOL with low potential at the output and the output sink current IOL with high level potential at the output.

$$IOLD = \beta^*(IcQ3 + IR1 - IR2) \qquad (19)$$

Noting that the dual phase-splitter transistors Q2 and Q3 are coupled in current mirror configuration so that the collector and base currents are matched when the feedback current ID2 is 0, equation (14) may be substituted into equation (19) giving the following expression for the difference current or step IOLD in the output sink current between the low and high level potentials at the output OUT:

$$IOLD = \beta^*(IR1) \qquad (20)$$

From this expression it is noted that the difference between the low voltage output current sink capability and the high voltage output current sink capability, here referred to as the gain "step" or gain "step-up" in the output sink current is here proportional to $\beta$ for the tristate output device of FIG. 2 as compared with the gain step-up proportional to $\beta^2$ for the bistate output device of FIG. 1. This is unfortunate because the high current sink mode afforded by the gain step-up proportional to $\beta^2$ is even more important and desirable for the tristate output devices than it is for the bistate output devices. This is because the tristate output devices are generally connected to long signal buses or common buses which are generally of lower impedance and are more capacitive. According to the prior art output devices, however, the combination of the desirable component configurations with enable gate input and feedback diodes using dual or multiple phase-splitter transistors results in a gain step-up for the current sinking capability between low level potential and high level potential at the output proportional to $\beta$ only and not $\beta^2$ with consequent loss of the high current sinking mode and loss of the gain step-up proportional to $\beta^2$ achieved in the bistate output devices.

OBJECTS OF THE INVENTION

It is therefore an object of the present invention to provide an improved multiple phase spliter TTL output circuit which incorporates both the enable gate input for tristate operation and the accelerating feedback diode from the output while maintaining the high current sink mode during transition from high to low level potential at the output.

Another object of the invention is to provide a multiple phase splitter TTL tristate output device with accelerating feedback diode circuit in which the difference between the low voltage current sink capability and the high voltage current sink capability, also referred to as the gain step or step-up in the output sink current is proportional to $\beta^2$.

A further object of the invention is to provide a multiple phase splitter TTL tristate output circuit with improved drive characteristics particularly applicable for driving large capacity loads or low impedance transmission lines characteristic of long signal buses or common buses.

DISCLOSURE OF THE INVENTION

In order to accomplish these results the invention provides an improved multiple phase-splitter TTL tristate output circuit having the prior art elements including a signal output for delivering binary signals of high or low potential, a pulldown transistor element for sinking current from the signal output to low potential, and a plurality of phase-splitter transistors having emitters coupled in parallel to the base of the pulldown transistor element for controlling the conducting state of the pulldown transistor. A feedback diode is coupled between the signal output and the collector of a first phase-splitter transistor to accelerate sinking of current from the output to low potential during transition of binary signals at the output from high to low potential as set forth in U.S. Pat. No. 4,255,670.

According to the invention, an independent base drive is coupled to the base of the first phase-splitter transistor independent from any base drive coupled to the other phase-splitter transistor or transistors thereby preventing current hogging of the base drive current to the first phase-splitter transistor by the other phase-splitter transistor or transistors. A feature and advantage of this arrangement is that the first phase-splitter transistor which is coupled in the feedback circuit with the accelerating feedback diode to the base of the pulldown transistor element can therefore maintain the high current sink mode through the pulldown transistor element with gain step-up proportional to $\beta^2$.

In the preferred embodiment with dual phase-splitter transistors, the phase-splitter transistors are provided with independent sources of base drive and are no longer coupled in the current mirror circuit configuration. The independent base drive may comprise, for example, a separate base drive resistor coupled in a circuit between high potential and the base of a respective phase-splitter transistor.

According to the example embodiment, each of the dual phase-splitter transistors is provided with a separate input transistor operatively coupled with the respective phase-splitter transistor. The collector of the input transistor is coupled to the base of the corresponding phase-splitter transistor and a base drive resistor is coupled between the base of the input transistor and high potential.

By this expedient, the current hogging of the base drive current to the phase-splitter transistor coupled in the accelerating feedback diode circuit by the other phase-splitter transistor or transistors is avoided thereby preserving the high current sink mode during transition from high to low level potential at the output and the gain step-up proportional to $\beta^2$ between the low output voltage current seeking capability and the high output voltage current sinking capability.

DESCRIPTION OF PREFERRED EXAMPLE EMBODIMENTS AND BEST MODE OF THE INVENTION

Figure 1:
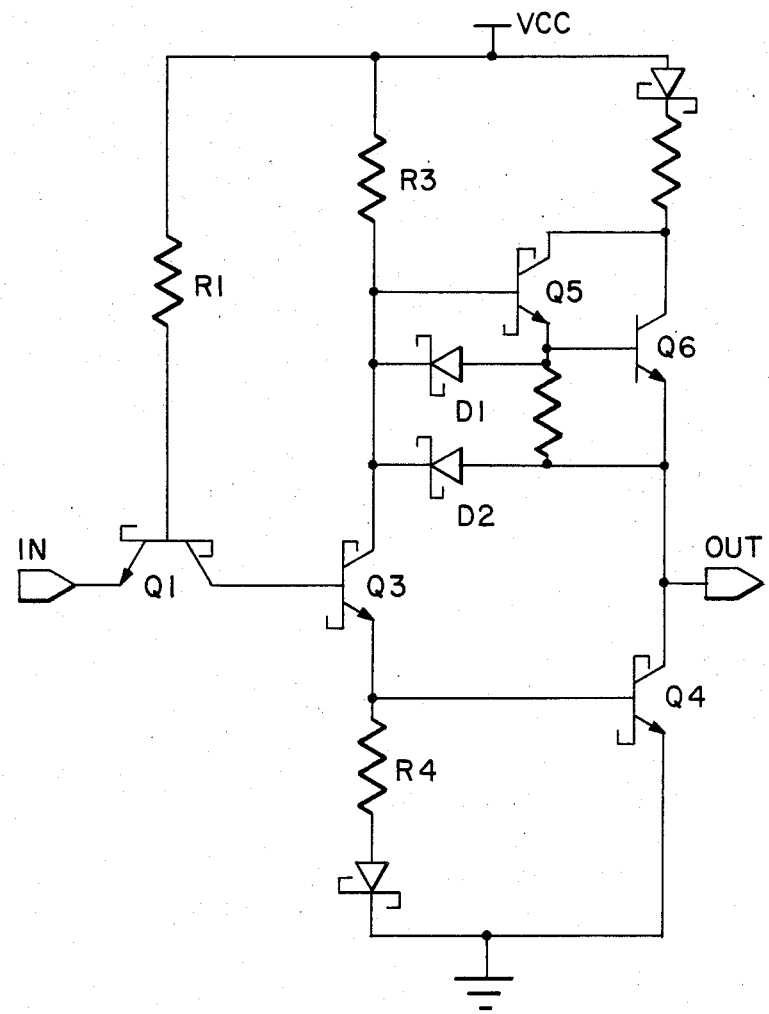
FIG. 1 is a schematic circuit diagram of a single phase-splitter TTL bistate output circuit according to the prior art.
Figure 2:
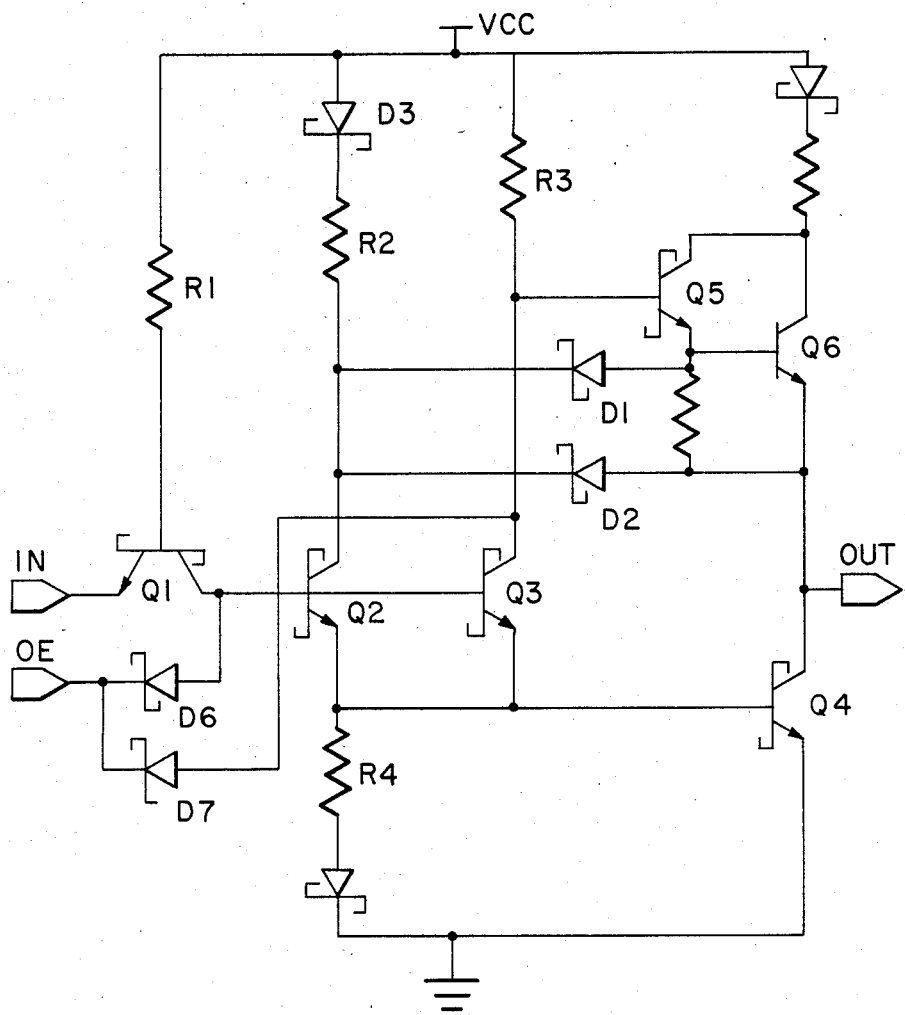
FIG. 2 is a schematic circuit diagram of a multiple phase-splitter TTL tristate output circuit according to the prior art.
Figure 3:
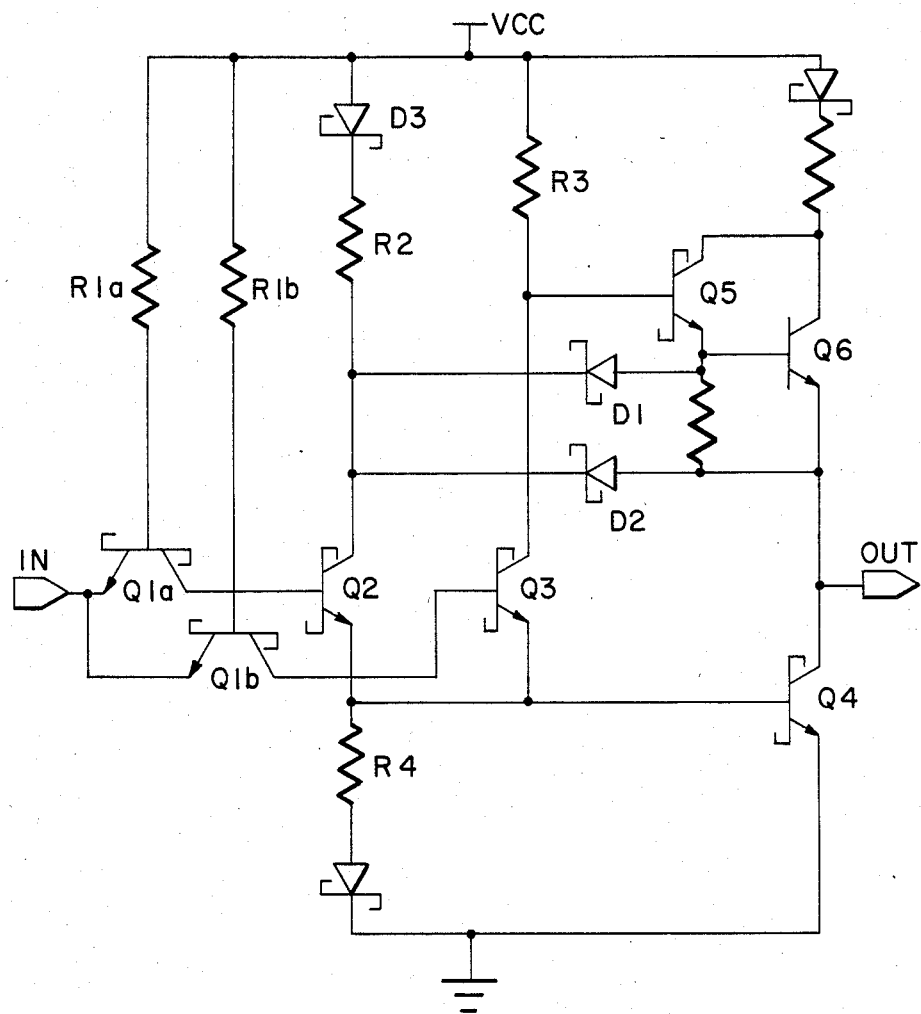
FIG. 3 is a multiple phase-splitter TTL output circuit with improved drive characteristics according to the present invention.

The improved multiple phase-splitter TTL output circuit according to the invention is illustrated in FIG. 3 in which the circuit components in common with the circuit of FIG. 2 are given the same reference designations. However, according to the present invention the dual phase-splitter transistors Q2 and Q3 are no longer connected in current mirror configuration. While the emitters of the dual phase-splitter transistors Q2 and Q3 remain coupled in parallel to the base of pulldown transistor Q4, the bases of phase-splitter transistors Q2 and Q3 are no longer coupled or tied together but are coupled separately with independent sources of base drive. To this end, rather than a single input transistor Q1 as shown in FIG. 2, the invention provides separate input transistors Q1a and Q1b in separate couplings respectively with the phase-splitters transistors Q2 and Q3. That is, the collector of input transistors Q1a is connected to the base of phase-splitter transistor Q2 while the collector of input transistor Q1b is connected to the base of phase-splitter transistor Q3. The emitters of the input transistors Q1a and Q1b are coupled in parallel to the signal input IN.

To provide the independent base drives to each of the respective phase-splitters transistors Q2 and Q3, rather than a single base drive resistor R1, as shown in FIG. 2, the invention provides separate base drive resistors R1a and R1b. The base drive resistor R1a for phase-splitter transistor Q2 is coupled between the base of input transistor Q1a and high potential source Vcc for providing base drive current through the base to collector junction of input transistor Q1a to the base of phase-splitter transistor Q2. The base drive resistor R1b is coupled between the base of input transistor Q1b and the high potential source Vcc for providing base drive current through the base to collector junction of input transistor Q1b to the base of phase-splitter transistor Q3.

Figure 4:
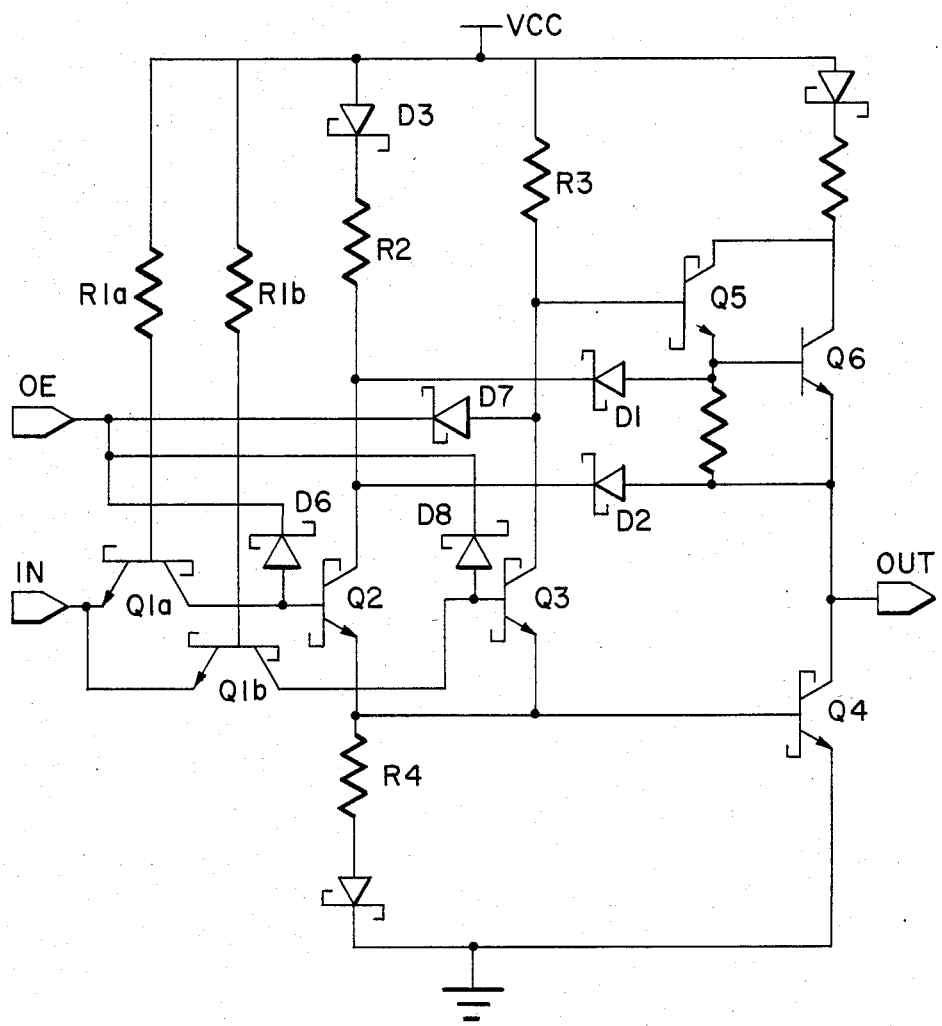
FIG. 4 is a schematic circuit diagram of the improved multiple phase-splitter TTL tristate output circuit with enable gate input.

This example embodiment circuit according to the present invention with appropriate coupling to an enable gate input OE is illustrated in FIG. 4. As shown in FIG. 4, the multiple phase-splitter TTL tristate output circuit is the same as that shown in FIG. 3 with the addition of enable input OE appropriately coupled to the circuit through three diodes D6, D7, and D8. In order to disable the output device for imparting the high impedance third state, the enable input signal at OE is separately coupled to the bases of dual phase-splitter transistors Q2 and Q3 because each base is connected in a separate base drive circuit. Thus, the enable gate input is coupled through diode D6 for turning off or disabling the accelerating feedback phase-splitter transistor Q2, and is coupled through diode D8 for turning off or disabling the other phase-splitter transistor Q3. The enable input signal is also coupled through diode D7 to the base of the pullup transistor element comprising the Darlington transistor pair Q5 and Q6 for turning off and disabling the pullup transistor element. The turning off and disabling of the phase-splitter transistors Q2 and Q3, of course, turns off the pulldown transistor element Q4. Thus, with a low level signal at the enable signal input OE, the output device presents a high impedance to any output bus behaving as if it were effectively disconnected.

The analysis of the output sink current for the circuit configurations of the multiple phase-splitter TTL output devices is derived from the following relationships for the circuit of FIG. 4 when a high level potential signal appears at the signal input IN and therefore a low level voltage appears at the signal output OUT:

$$IbQ2 = IR1a \tag{21}$$

$$IbQ3 = IR1b \tag{22}$$

$$IcQ2 = IR2 + ID2 \tag{23}$$

$$IcQ3 = IR3 \tag{24}$$

$$IbQ4 = IbQ2 + IcQ2 + IbQ3 + IcQ3 - IR4 \tag{25}$$

$$IbQ4 = IR1a + IR2 + ID2 + IR1b + IR3 - IR4 \tag{26}$$

As previously discussed the basic equation for the output sink current IOL through the pulldown transistor Q4 is:

$$IOL = \beta * IbQ4 \tag{27}$$

With the output device in the state referenced above, that is a low level output voltage Vo less than VbeQ4+VsatQ2+VD2, then there is no accelerating feedback current from the signal output OUT and diode D2 is not conducting. Substituting equation (26) into equation (27) and with no accelerating feedback current so that ID2=0, then the output sink current IOL is:

$$IOL(Vo < VbeQ2 - VsatQ2 + VD2) = \beta*(IR1a + IR2 - 2 + IR1b + IR3 - IR4) \tag{28}$$

When the output voltage Vo at the signal output OUT is at high potential level or increased so that Vo is greater than VbeQ4+VsatQ2+VD2, then accelerating feedback diode D2 starts to conduct and pull phase-splitter transistor Q2 out of saturation and into the linear operating region. When this happens, $$IcQ2 = \beta*IbQ2$$

$$IcQ2 = \beta*Ir1a \tag{29}$$

Substituting the expression given in equation (29) into equation (25) and substituting that in turn into equation (27) gives the following equation for the output sink current IOL for the state of the output device when Vo is at the high potential level.

$$IOL(Vo > VbeQ4 + VsatQ2 + VD2) = \beta*((\beta+1)*IR-1a+IR1b+IR3-IR4) \tag{30}$$

The difference between the low output voltage current sinking capability and the high output voltage current sinking capability designated IOLD and also referred to as the gain step or step-up in the output sink current between the low voltage state and high voltage state at the output OUT is, therefore, $$IOLD = \beta^2*IR1a - \beta*IR2 \tag{31}$$

It is apparent that the multiple phase-splitter TTL tristate output circuit configuration, according to the present invention, with separate base drives for the multiple phase-splitter transistors once again achieves the desired output sink current gain step-up or difference proportional to $\beta^2$. Thus, the difference in the output sink current from the low voltage output state to the high voltage output state is proportional to $\beta^2$ and the output device can operate in the high current sink mode during transition at the output from a high potential level to a low potential level signal.

The capability of operating in the high current sink mode with a $\beta^2$ gain step-up in current sinking capability when a high level voltage is at the output is accomplished according to the present invention by eliminating or avoiding "hogging" of the base drive current to the accelerating feedback phase-splitter transistor Q2 by the other phase-splitter or phase-splitters in the output device circuit which would otherwise occur in the conventional current mirror configuration. Thus, the present invention contemplates providing separate and independent sources of base drive for each of the dual phase-splitter transistors. With multiple phase-splitter transistors greater than 2, generally only two independent sources of base drive are required, one for the accelerating feedback phase-splitter transistor Q2 so that the base drive current to this transistor can remain independent from all of the other phase-splitter transistors. The other multiple phase-splitter transistors may be coupled to a common source of base drive provided the phase-splitter transistor in the functional position of transistor Q2 remains independent in its source of base drive from the other phase-splitter transistors. Current hogging is therefore avoided and the accelerating feedback phase-splitter transistor Q2 can drive the pulldown transistor Q4 with the $\beta^2$ gain step-up in the high current sink mode.

It is apparent that other base drive circuits can be incorporated into the improved multiple phase-splitter TTL tristate output circuit, according to the present invention, as long as an independent source of base drive is provided to the first phase-splitter transistor in the functional position of the accelerating feedback phase-splitter transistor Q2. Thus, for example, instead of using input transistors such as Q1a and Q1b, input diodes may also be used with the separate base drive resistors R1a and R1b coupled respectively to the bases of the dual or multiple phase-splitter transistors. The invention is of course also applicable to TTL tristate output devices with three or more phase-splitter transistors. While the invention has been described with reference to particular example embodiments, it is intended to cover all variations and equivalents within the scope of the following claims.

We claim:

1. An improved multiple phase-splitter TTL output circuit having a signal input for receiving binary signals of low or high potential, a signal output for delivering binary signals of high or low potential, pulldown transistor means coupled to the signal output for sinking current from the signal output to low potential, a plurality of at least first and second phase-splitter transistor means having emitters coupled in parallel to the base of the pulldown transistor means for controlling the conducting state of the pulldown transistor means, said first and second phase-splitter transistor means being operatively coupled in phase at the signal input for simultaneous switching of the first and second phase splitter transistor means in phase in response to signals at the signal input, the improvement comprising:

feedback diode means coupled between the signal output and the collector of the first phase-splitter transistor means to accelerate sinking of current from the output to low potential during transition of binary signals at the output from high to low potential; and independent first and second base drive means respectively coupled to the bases of the first and second phase-splitter transistor means said first base drive means coupled to the first phase-splitter transistor means being independent from the second base drive means coupled to the second phase splitter transistor means while the first and second phase splitter transistor means are operatively coupled in phase to the signal input for simultaneous switching in phase in response to signals at the signal output, thereby preventing current hogging of the base drive current to the first phase-splitter transistor means by eliminating current mirroring in the second phase-splitter transistor means.

2. The circuit of claim 1 wherein the independent first and second base drive means each comprises a separate base drive resistor coupled in a circuit between high potential and the base of the respective first or second phase-splitter transistor means for providing independent base drive.

3. An improved multiple phase-splitter TTL tristate output circuit having a signal input for receiving binary signals of low or high potential, a signal output for delivering binary signals of high or low potential, a pulldown transistor for sinking current from the signal output to low potential, a plurality of at least first and second phase-splitter transistors having emitters coupled in parallel to the base of the pulldown transistor for controlling the conducting state of the pulldown transistor, said first and second phase-splitter transistors being operatively coupled in phase at the signal input for simultaneous switching of the first and second phase splitter transistors in phase in response to signals at the signal input, the improvement comprising:

feedback diode means coupled between the signal output and the collector of the first phase-splitter transistor to accelerate sinking of current from the output to low potential during transition of binary signals at the output from high to low potential; and a plurality of independent phase-splitter base drive means respectively independently coupled to the bases of the plurality of phase splitter transistors while the first and second phase splitter transistors are operatively coupled in phase to the signal input for simultaneous switching in phase in response to signals at the signal input, thereby preventing hogging of the base drive current to the first phase-splitter transistor by other phase-splitter transistors so that the first phase-splitter transistor operates out of saturation in the linear region for improved drive of the pulldown transistor and for operation of the pulldown transistor in the high current sinking mode.

4. The circuit of claim 3 wherein each phase-splitter base drive means comprises an input transistor operatively coupled with a phase-splitter transistor, the collector of the input transistor being coupled to the base of the corresponding phase-splitter transistor, and a base drive resistor coupled between the base of the input transistor and high potential.

5. An improved multiple phase-splitter TTL tristate output circuit having a signal input, a signal output, a pulldown transistor element for sinking current from the signal output to low potential, a pullup transistor element for sourcing current to the signal output from high potential, a plurality of phase-splitter transistor elements having respective emitters coupled in parallel to the base of the pulldown transistor element for controlling the conducting state of the pulldown transistor element, said plurality of phase-splitter elements being operatively coupled in phase at the signal input for simultaneous switching of the first and second phase splitter transistor elements in phase in response to signals at the signal output, feedback diode means coupling the signal output to the collector of the first phase-splitter transistor element for accelerating sinking of current from the signal output to low potential during transition at the signal output from high to low potential, a second one of said phase-splitter transistor elements having its collector coupled to the base of the pullup transistor element for controlling the conducting state of the pullup transistor element, and an enable input coupled to the base of the pullup transistor element and also coupled respectively to the bases fo the multiple phase-splitter transistor elements for establishing a high impedance third state at the signal output, said improvement comprising:

first and second independent base drive means operatively coupled respectively to the bases of the first and second phase-splitter transistor elements while the first and second phase-splitter transistor elements are operatively coupled in phase to the signal input for simultaneous switching in phase in response to signals at the signal input, thereby preventing current hogging of the base drive current to the first phase-splitter transistor element by eliminating current mirroring in the second phase-splitter transistor element and thereby mantaining a high current sinking mode through the pulldown transistor element during transition from high to low potential at the signal output.

6. The circuit of claim 5 wherein each independent base drive means comprises a base drive resistor and an input transistor, said base drive resistor coupled between high potential and the base of the input transistor, said input transistor coupled between a respective phase-splitter transistor element and the signal input with the emitter of the input transistor coupled to the signal input and the collector of the input transistor coupled to the base of the respective phase-splitter transistor element.

7. The circuit of claim 5 wherein each of the independent base drive means comprises base drive resistor means coupled in a circuit between the base of a respective phase-splitter transistor element and high potential, and diode means coupling the respective first and second base drive means to the signal input.

8. The circuit of claim 5 further comprising a plurality of input transistors, at least one for each phase-splitter transistor element, said input transistors coupled respectively to the phase-splitter transistor elements with the emitters of the input transistors coupled in parallel to the signal input, each input transistor having its collector coupled to the base of a respective phase-splitter transistor element, and a plurality of base drive resistors coupled in parallel, each base drive resistor operatively coupled for providing separate base drive to a respective phase splitter transistor element.

9. The circuit of claim 5 further comprising a plurality of enable diode means, a first enable diode means coupled between the base of the pullup transistor element and the enable input, and further diode means coupled respectively between the base of each phase-splitter transistor element and the enable input, said enable diode means oriented for passing current in the direction of the enable input.

10. The circuit of claim 5 wherein each independent base drive means comprises a separate phase-splitter base drive resistor coupled in a circuit between high potential and the base of the respective phase-splitter transistor element.

11. The circuit of claim 5 wherein each independent base drive means is coupled between the base of one of the phase-splitter transistor elements and high potential for providing independent base drive to the respective phase-splitter transistor element, each independent base drive means also being coupled to the signal input for simultaneous control of the conducting state of the corresponding phase-splitter transistor elements in phase according to the high or low potential binary signal at the signal output.

* * * * *